(12) United States Patent
Ishii (10) Patent No.: US 7,633,090 B2
(45) Date of Patent: Dec. 15, 2009

(54) THIN FILM TRANSISTOR PANEL

(75) Inventor: Hiromitsu Ishii, Mitaka (JP)

(73) Assignee: Casio Computer Co., Ltd., Tokyo (JP)

( * ) Notice: Subject to any disclaimer, the term of this patent is extended or adjusted under 35 U.S.C. 154(b) by 7 days.

(21) Appl. No.: 11/357,595

(22) Filed: Feb. 17, 2006

(65) Prior Publication Data

US 2006/0194500 A1 Aug. 31, 2006

(30) Foreign Application Priority Data

Feb. 28, 2005 (JP) ............... 2005-054402

(51) Int. Cl.
*H01L 29/10* (2006.01)
*H01L 29/786* (2006.01)

(52) U.S. Cl. ............ 257/72; 257/66; 257/435; 257/E29.282

(58) Field of Classification Search ........ 257/72, 257/435, 66, 71, 59, E27.111, E29.043, E29.282, 257/E27.147
See application file for complete search history.

(56) References Cited

U.S. PATENT DOCUMENTS

| | | | |
|---|---|---|---|
| 5,345,324 A | 9/1994 | Koseki et al. | |
| 5,510,916 A | 4/1996 | Takahashi | |
| 5,744,864 A | 4/1998 | Cillessen et al. | |
| 6,040,882 A * | 3/2000 | Jun et al. | 349/39 |
| 6,069,370 A | 5/2000 | Hayama et al. | |
| 6,303,963 B1 | 10/2001 | Ohtani et al. | |
| 6,509,616 B2 * | 1/2003 | Yamazaki | 257/390 |
| 6,610,997 B2 * | 8/2003 | Murade | 257/72 |
| 7,319,239 B2 * | 1/2008 | Tsubata et al. | 257/72 |
| 7,495,387 B2 | 2/2009 | Hayashi et al. | |
| 2002/0058362 A1 | 5/2002 | Ohtani et al. | |
| 2002/0063810 A1 | 5/2002 | Nakajima | |
| 2003/0111663 A1 | 6/2003 | Yagi | |
| 2003/0168688 A1 | 9/2003 | Ohtani et al. | |

(Continued)

FOREIGN PATENT DOCUMENTS

CN 1079826 A 12/1993

(Continued)

OTHER PUBLICATIONS

Ohta, H. et al., "Frontier of Transparent Oxide Semiconductor" solid State Electronics, Elsevier Science Publishers, Barking, GB, vol. 47, No. 12, Dec. 2003, pp. 2261-2267, XP004464944, ISSN: 0038-1101.

(Continued)

*Primary Examiner*—Anh Phung
*Assistant Examiner*—Allison P Bernstein
(74) *Attorney, Agent, or Firm*—Frishauf, Holtz, Goodman & Chick, P.C.

(57) ABSTRACT

A thin film transistor panel, including: a transparent substrate; scanning lines made of a transparent electroconductive material, formed on the transparent substrate; data lines formed on the transparent substrate to be perpendicular to the scanning lines; thin film transistors, each provided with a transparent gate electrode connected to one of the scanning lines, a transparent drain electrode connected to one of the data line, a transparent source electrode and a transparent semiconductor thin film; and transparent pixel electrodes connected to the thin film transistors, wherein each of the pixel electrodes is formed to cover each of the thin film transistors.

16 Claims, 5 Drawing Sheets

U.S. PATENT DOCUMENTS

| | | |
|---|---|---|
| 2003/0203545 A1 | 10/2003 | Hamada et al. |
| 2003/0218221 A1 | 11/2003 | Wager, III et al. |
| 2003/0218222 A1 | 11/2003 | Wager, III et al. |
| 2004/0155270 A1 | 8/2004 | Hoffman |
| 2004/0155846 A1 | 8/2004 | Hoffman et al. |
| 2005/0001945 A1 | 1/2005 | Iki |
| 2006/0033108 A1 | 2/2006 | Hoffman |
| 2006/0192204 A1 | 8/2006 | Yamaguchi et al. |

FOREIGN PATENT DOCUMENTS

| | | |
|---|---|---|
| EP | 0 595 363 A1 | 5/1994 |
| JP | 2003-179233 A | 6/2003 |
| JP | 2003-243154 A | 8/2003 |
| JP | 2004-014982 | 1/2004 |

OTHER PUBLICATIONS

Related U.S. Appl. No. 11/356,407, filed Feb. 16, 2006; Inventor: I. Yamaguchi.

Notification Concerning Transmittal of International Preliminary Report on Patentability, Chapter I of the Patent Cooperation Treaty, and Written Opinion of the International Searching Authority, dated Sep. 11, 2007, for PCT/JP2006/303351 8 sheets.

Chinese Office Action dated Apr. 10, 2009 (6 pages), and English translation thereof (5 pages), issued in counterpart Chinese Application Serial No. 200680000175.6 of *related* U.S. Appl. No. 11/356,407.

Japanese Office Action dated Sep. 29, 2009 and English translation thereof issued in a counterpart Japanese Application No. 2005-054402.

Chinese Office Action dated Sep. 25, 2009 and English translation thereof issued in a counterpart Chinese Application No. 200680006042X.

* cited by examiner

THIN FILM TRANSISTOR PANEL

BACKGROUND OF THE INVENTION

1. Field of the Invention

The present invention relates to a thin film transistor panel.

2. Description of Related Art

As a thin film transistor panel in a liquid crystal display device, an active matrix type thin film transistor panel has been known. In the active matrix type thin film transistor panel, numerous scanning lines and numerous data lines are formed on a substrate in a manner of extending in directions in which the scanning lines and the data lines are perpendicular to each other. In each region enclosed by a couple of scanning lines and a couple of data lines, a pixel electrode and a thin film transistor as a switching element are formed. Each pixel electrode is connected to a corresponding scanning line and a corresponding data line through a thin film transistor. Thus, display pixels are formed in a matrix. Moreover, JP 2003-50405A discloses a method of reducing manufacturing processes by applying a transparent material such as zinc oxide or the like onto a semiconductor layer of a thin film transistor to integrally form the semiconductor layer and a transparent pixel electrode with the same material. In this case, the pixel electrode is made of a semiconductor material including impurities, and is formed on the same layer as that of the semiconductor thin film of the thin film transistor in the manner of being connected to the semiconductor thin film. The gate electrode of the thin film transistor and the scanning line connected to the gate electrode are formed with an aluminum alloy.

Because the gate electrode of a thin film transistor in the conventional thin film transistor panel is formed with the aluminum alloy, namely a light blocking electroconductive material, the portion of the gate electrode does not contribute to the opening ratio of the pixel, and consequently the conventional thin film transistor panel has a problem in which the opening ratio is small.

SUMMARY OF THE INVENTION

Accordingly, it is an object of the present invention to provide a thin film transistor panel capable of reducing the manufacturing processes and of improving the opening ratio thereof.

According to an aspect of the invention, the thin film transistor panel comprises: a transparent substrate (1); scanning lines (2) made of a transparent electroconductive material, formed on the transparent substrate (1); data lines (3) formed on the transparent substrate (1) to be perpendicular to the scanning lines (2); thin film transistors (5) each provided with a transparent gate electrode (11) connected to one of the scanning lines (2), a transparent drain electrode (16) connected to one of the data lines (3), a transparent source electrode (15) and a transparent semiconductor thin film (13); and transparent pixel electrodes (4) connected to the thin film transistors (5), wherein each of the pixel electrodes (4) is formed to cover each of the thin film transistors (5).

DETAILED DESCRIPTION OF THE PREFERRED EMBODIMENTS

First Embodiment

Figure 1:
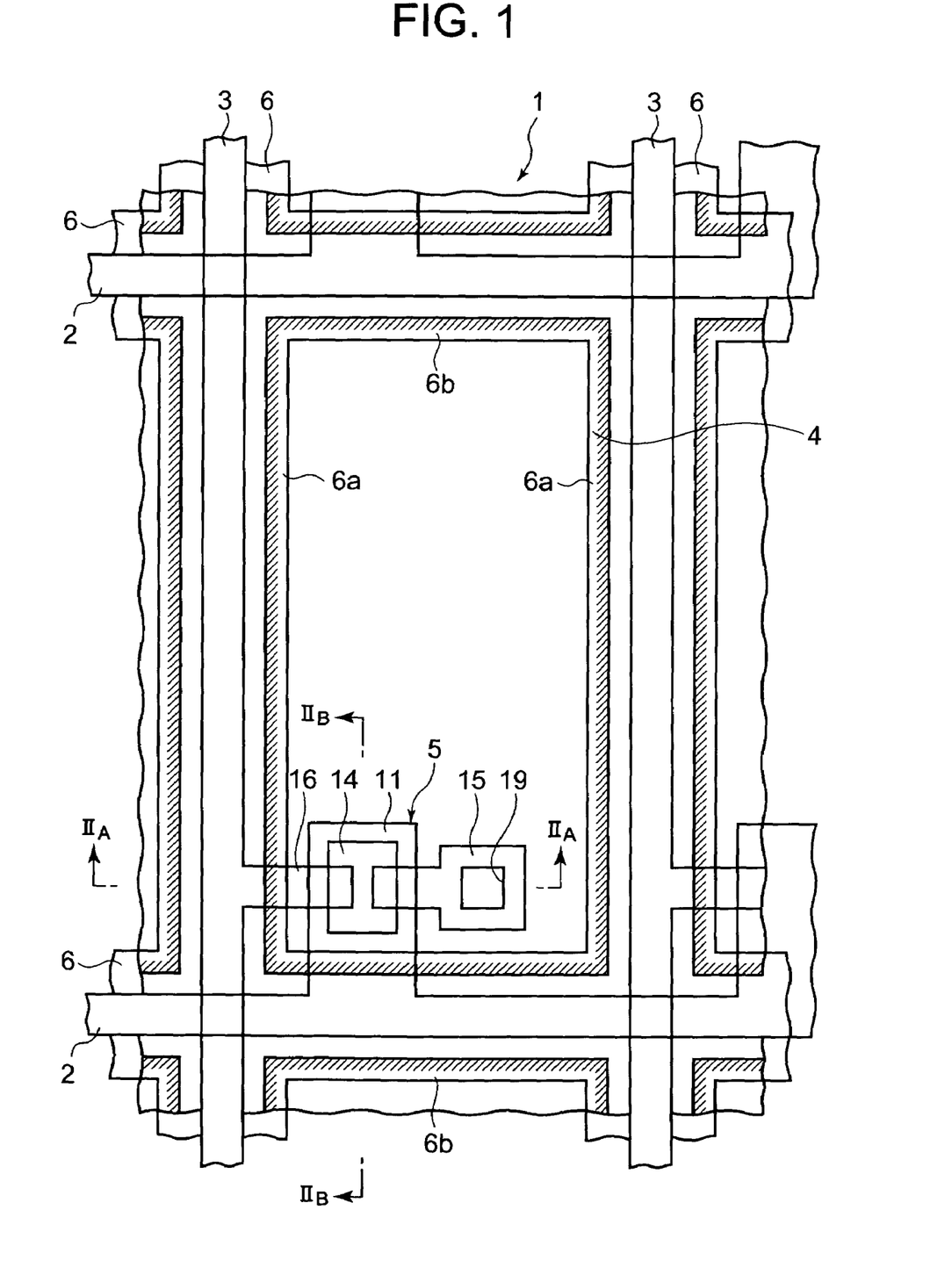
FIG. 1 is a plan view of the principal part of a thin film transistor panel in a liquid crystal display device as a first embodiment of the invention.
Figure 2A:
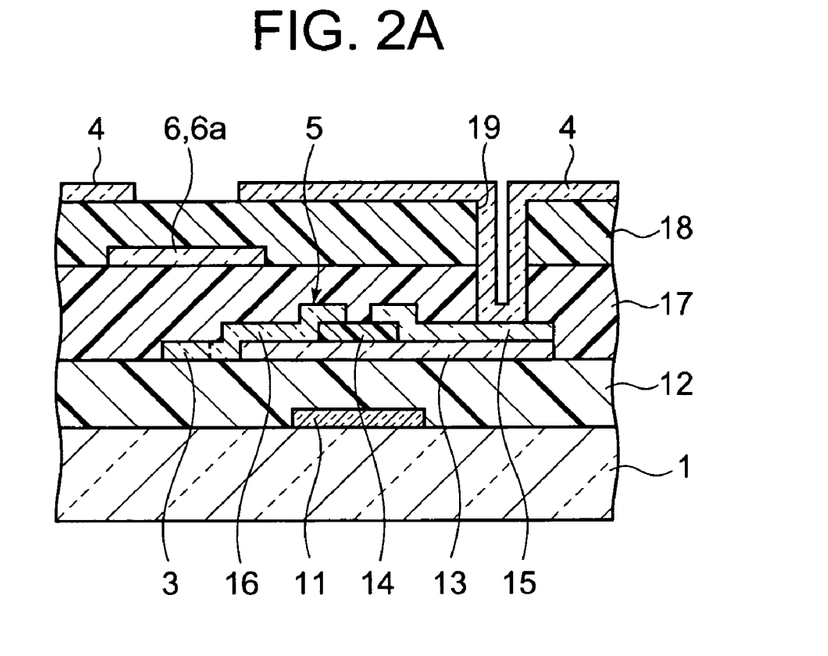
FIG. 2A is a sectional view taken along a line $II_A$-$II_A$ in FIG. 1.
Figure 2B:
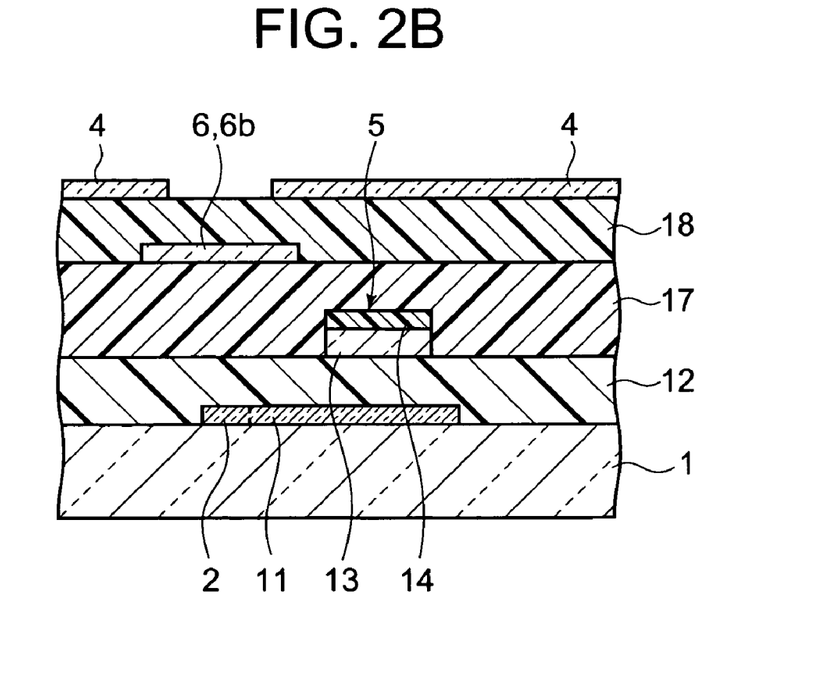
FIG. 2B is a sectional view taken along a line $II_B$-$II_B$ in FIG. 1.

FIG. 1 shows a plan view of the principal part of a thin film transistor panel in a liquid crystal display device as a first embodiment of the invention. FIG. 2A shows a sectional view taken along a line $II_A$-$II_A$ in FIG. 1, and FIG. 2B shows a sectional view taken along a line $II_B$-$II_B$ in FIG. 1. The thin film transistor panel is provided with a glass substrate 1.

First, a description is given by referring to FIG. 1. Scanning lines 2 and data lines 3 are formed in a matrix on the top face side of the glass substrate 1. A pixel electrode 4 is formed to be connected to one of the scanning lines 2 and one of the data lines 3 through a thin film transistor 5 in each of the regions enclosed by both the lines 2 and 3. Moreover, a grid-like auxiliary capacity electrode 6 is provided in parallel with the scanning lines 2 and the data lines 3. Here, with an object of clarifying FIG. 1, the edge portions of the pixel electrodes 4 are hatched by oblique short solid lines.

In this case, each of the almost square-like pixel electrodes 4 is arranged in each of the square-like regions enclosed by the scanning lines 2 and the data lines 3 in the state in which the pixel electrode 4 is positioned as near as possible to the scanning lines 2 and the data lines 3. Each of the edge portions of the four sides of the pixel electrode 4 is overlapped with the grid-like auxiliary capacity electrode 6 arranged around the edge portion. The thin film transistor 5 is arranged on the under side of the lower left corner part of the pixel electrode 4 in FIG. 1, and almost the whole part of the thin film transistor 5 is covered by the pixel electrode 4.

The grid-like auxiliary capacity electrode 6 is composed of first auxiliary capacity electrode portions 6a including portions overlapped with the data lines 3 and second auxiliary capacity electrode portions 6b including portions overlapped with the scanning lines 2. In this case, the auxiliary capacity electrode 6 is formed on a layer other than the scanning lines 2, and especially the first auxiliary capacity electrode portions 6a of the auxiliary capacity electrode 6 are formed between the data lines 3 and the pixel electrodes 4 with insulation films between the auxiliary capacity electrodes 6a and the data lines 3, and with insulation films between the pixel electrodes 4 and the auxiliary capacity electrodes 6a in the thickness directions, namely in the directions perpendicular to the paper surface of FIG. 1. The arrangement of the auxiliary capacity electrode 6 in the thickness directions will be described later.

Then, the width of each of the first auxiliary capacity electrode portions 6a is formed to be larger than the width of each of the data lines 3 by a certain degree. Thereby, the first auxiliary capacity electrode potions 6a are formed to cover the data lines 3 surely lest the data lines 3 should be directly opposed to the pixel electrodes 4 even if the first auxiliary capacity electrode portions 6a have been positionally shifted into the directions perpendicular to the data lines 3. Moreover, each of the first auxiliary capacity electrode portions 6a is arranged over almost the whole area of each of the arranged regions of the data lines 3. Thereby, the first auxiliary capacity electrode portions 6a are formed to the pixel electrodes 4 so that the changes of the auxiliary capacity caused by alignment shifts in the directions parallel to the data lines 3 may be surely prevented by being overlapped with the right and left side parts of the pixel electrodes 4 even if the first auxiliary capacity electrode portions 6a have shifted in the directions.

The width of each of the second auxiliary capacity electrode portions 6b is formed to be wider than the width of each of the scanning lines 2 by a certain degree. Thereby, the second auxiliary capacity electrode potions 6b are formed to cover the scanning lines 2 surely even if the second auxiliary capacity electrode portions 6b have been positionally shifted into the directions perpendicular to the scanning lines 2. Moreover, each of the second auxiliary capacity electrode portions 6b is arranged over the whole area of each of the arranged regions of the scanning lines 2. Thereby, the second auxiliary capacity electrode portions 6b are formed to the pixel electrodes 4 so that the changes of the auxiliary capacity caused by alignment shifts in the directions parallel to the scanning lines 2 may be surely prevented by being overlapped with the upper and lower side parts of the pixel electrodes 4 even if the second auxiliary capacity electrode portions 6b have shifted in the directions.

Next, the concrete structure of the thin film transistor panel is described by referring to FIGS. 2A and 2B. Gate electrodes 11 and the scanning lines 2 connected to the gate electrodes 11 are formed at predetermined places of the top face of the glass substrate 1. In this case, the gate electrodes 11 and the scanning lines 2 are formed with a transparent metal oxide containing n type or p type impurities. As the transparent metal oxide, for example, zinc oxide, magnesium zinc oxide, cadmium zinc oxide and the like can be cited. As the n type impurities, for example, phosphorus, arsenic, antimony and the like can be cited. As the p type impurities, for example, boron, aluminum, gallium, indium and the like can be cited.

As the forming method of the gate electrodes 11 and the scanning lines 2, a method of forming a film by a sputtering method using a metal oxide film including the n type or the p type impurities as a target to pattern the formed film by using a photolithography technique is recommended. In the respects of electric field mobility, the stability of characteristics, and workability, the n type metal oxide film is generally suitable. However, because the n type metal oxide film is a depletion type metal oxide film and the leakage current thereof is large, the p type metal oxide film can be also used in case of regarding being low power consumption, but the use of the p type metal oxide film does not mean that the metal oxide film to be used for the formation of the gate electrodes 11 and the scanning lines 2 is limited to the p type metal oxide film.

A gate insulating film 12 made of silicon nitride is formed on the top face of the glass substrate 1 having the gate electrodes 11 and the scanning lines 2 thereon. Semiconductor thin films 13, which severally have a band gap of 2.5 V or higher and are severally made of one of the transparent and intrinsic metal oxides mentioned above, are formed on the top face of the gate insulating film 12 on the gate electrodes 11. Because the semiconductor thin films severally having a wide band gap of 2.5 V or higher do not absorb any visible light, the semiconductor thin films do not leak any light, and do not need light blocking consequently. Channel protecting films 14, which are made of silicon nitride, are formed at almost the central parts of the top faces of the semiconductor thin films 13.

A source electrode 15, a drain electrode 16 and a data line 3 connected to the drain electrode 16, all made of a transparent n type metal oxide, are formed on both the sides of the top face of each of the channel protecting films 14, the top face of a semiconductor thin film 13 on both the sides of the channel protecting film 14, and each predetermined place of the top face of the gate insulating film 12. The materials of the metal oxide and the n type impurities are the same as those in case of the gate electrodes 11 and the scanning lines 2. The source electrodes 15, the drain electrodes 16 and the data lines 3 are formed as the films by the method of forming a film by the sputtering method using an n type metal oxide film as a target to pattern the source electrodes 15, the drain electrodes 16 and the data lines 3 by using the photolithography technique similarly to the case of the gate electrodes 11 and the scanning lines 2.

Here, the thin film transistors 5 of the bottom gate structure are composed of the gate electrodes 11, the gate insulating film 12, the semiconductor thin films 13, the channel protection films 14, the source electrodes 15 and the drain electrodes 16. In this case, because the gate electrodes 11 are formed of the transparent p type metal oxide or the n type metal oxide, and because the source electrodes 15 and the drain electrodes 16 are formed of the transparent n type metal oxide, the thin film transistors 5 severally have a structure which transmits light.

An interlayer insulation film 17 made of silicon nitride is formed on the top face of the gate insulating film 12 having the thin film transistors 5 and the data lines 3 thereon. The auxiliary capacity electrode 6 made of a light blocking metal such as aluminum, chromium and the like is formed at predetermined positions on the top face of the interlayer insulation film 17. An overcoat film (insulation film) 18 made of silicon nitride is formed on the top face of the interlayer insulation film 17 having the auxiliary capacity electrode 6 thereon.

Contact holes 19 are formed at the portions of the overcoat film 18 and the interlayer insulation film 17 corresponding to predetermined positions of the source electrodes 15. The pixel electrodes (electrodes for pixels) 4, which are made of a transparent metal oxide including n type or p type impurities, or which are made of a transparent electroconductive material such as ITO, are formed at the predetermined positions of the overcoat film 18 to be electrically connected with the source electrodes 15 through the contact holes 19. In this case, each of the pixel electrodes 4 is formed to cover almost all of each of the thin film transistors 5.

As described above, because in the thin film transistor panel each of the thin film transistors 5 has the structure transmitting light and almost the whole of the thin film transistor 5 is covered with each of the pixel electrodes 4, the overlapped portions of the thin film transistors 5 and the pixel electrodes 4 contribute to the opening ratio. Consequently, the opening ratio can be enlarged. In this case, although light enters the semiconductor thin films 13, which are severally made of the transparent intrinsic metal oxide mentioned above, of the thin film transistors 5, the semiconductor thin films 13 transmit the entered light as it is, and no problems are cased consequently.

Moreover, in the thin film transistor panel, the auxiliary capacity electrode 6 made of the light blocking metal such as the aluminum, the chromium or the like, is overlapped with all the peripheral portions of the square-like pixel electrodes 4, and the auxiliary capacity electrode 6 covers the transparent scanning lines 2 each arranged between the pixel electrodes 4 arranged at an upper and a lower positions and the transparent data lines 3 each arranged between the pixel electrodes 4 arranged at a left and a right positions. Consequently, the portions other than the substantial pixel regions except the all of the peripheral portions in the arrangement regions of the pixel electrodes 4 including the arrangement regions of the thin film transistors 5 can be surely covered with the auxiliary capacity electrode 6. Consequently, the boundary part and the outside of the display region of each pixel are light-blocked. Thereby, it is possible to eliminate the use of a light blocking film (black mask) that is ordinarily formed on an opposite substrate, which is arranged to be opposed to the thin film transistor panel, and on which color filters, common electrodes and the like are formed.

Incidentally, it is desirable to perform the light blocking the parts between the pixel electrodes 4 in order to partition display between pixels and to improve contrast when a liquid crystal display device is configured using the thin film transistor panel. For that, it is recommended to adopt either of the following configurations.

(1) When the liquid crystal display device is in a normal black mode, the potential applied to the auxiliary capacity electrode is made to the same potential as the potential applied to the common electrodes formed on the opposed electrode panel arranged to be opposed to the thin film transistor panel.

(2) When the liquid crystal display device is in a normal white mode, a voltage for displaying a black display is applied between the auxiliary capacity electrode and the common electrodes.

In the above, the normal black mode means a liquid crystal display mode of performing a white display when no electric fields are applied. For example, in case of a TN liquid crystal having a twisted angle of 90°, the upper and the under polarizing plates are arranged so that their transmission axes may be parallel to each other. Moreover, the normal white mode means a liquid crystal display mode of displaying black when no electric fields are applied. For example, in the TN liquid crystal having the twisted angle of 90°, the upper and the lower polarizing plates are arranged so that their transmission axes may be perpendicular to each other.

Moreover, although the auxiliary capacity electrode is used in the embodiment in order to supplement the capacity of liquid crystal, the invention is also possible to be applied to a liquid crystal display device having a configuration in which gate lines are also used as the auxiliary capacity electrode. In that case, the light blocking films between the pixel electrodes 4 can be formed with a light blocking resin.

Moreover, in the thin film transistor panel, because the first auxiliary capacity electrode portions 6a having the widths wider than the widths of the data lines 3 are formed between the data lines 3 and the pixel electrodes 4, the generation of coupling capacity between the data lines 3 and the pixel electrodes 4 can be prevented by the first auxiliary capacity electrode portions 6a, and consequently the generation of perpendicular cross talks can be prevented to enable to improve the display characteristics.

Second Embodiment

Figure 3:
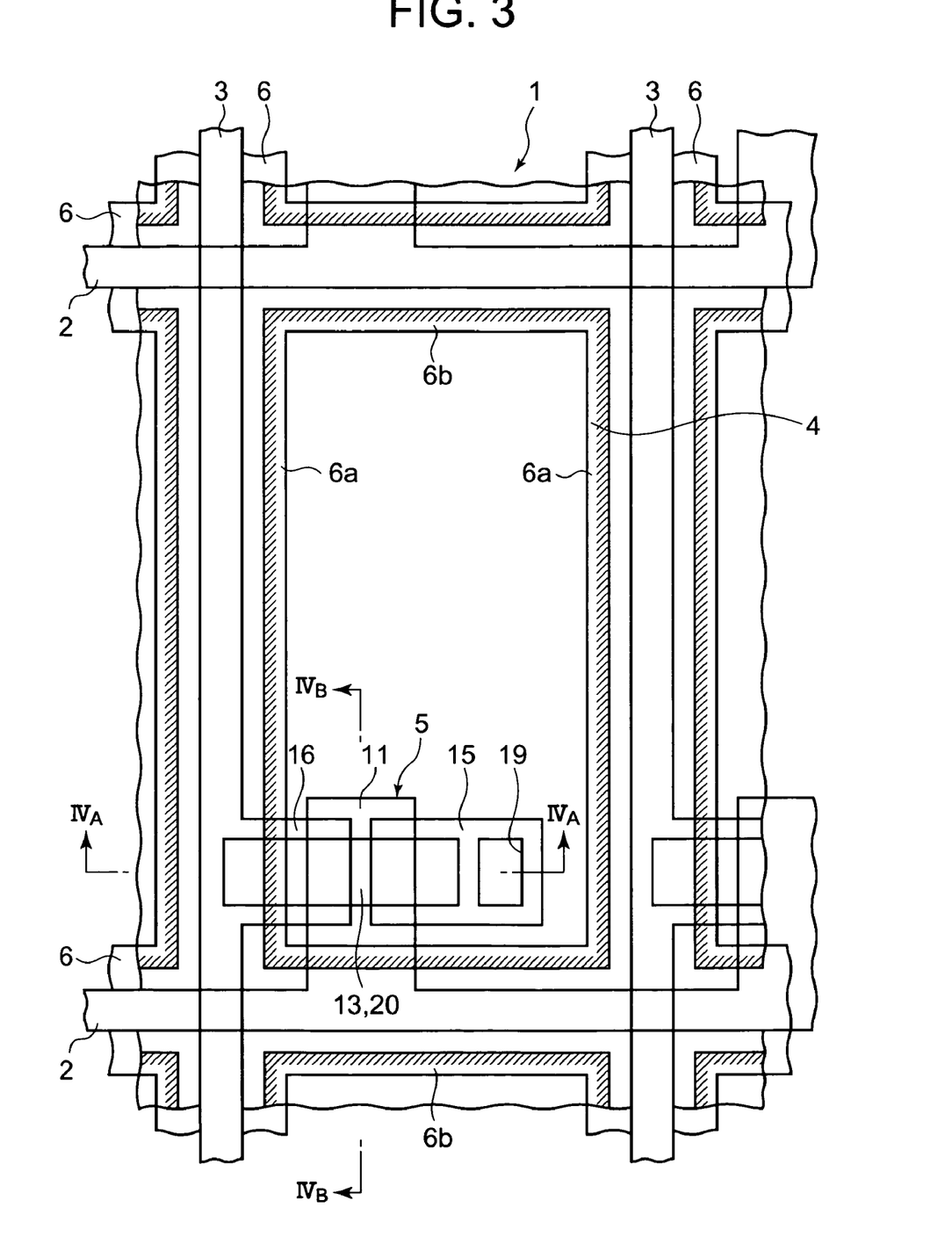
FIG. 3 is a plan view of the principal part of a thin film transistor panel in a liquid crystal display device as a second embodiment of the invention.
Figure 4A:
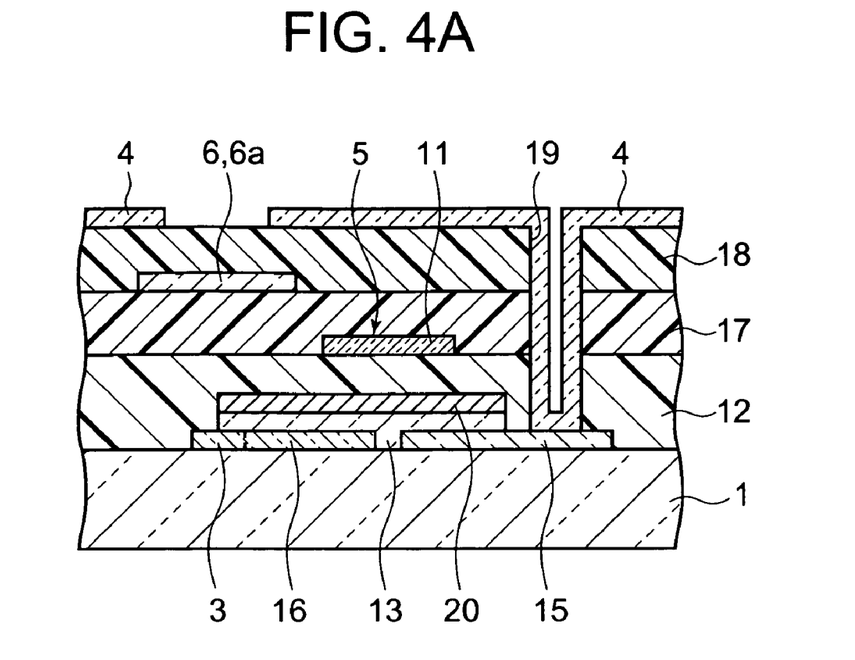
FIG. 4A is a sectional view taken along a line $IV_A$-$IV_A$ in FIG. 3.
Figure 4B:
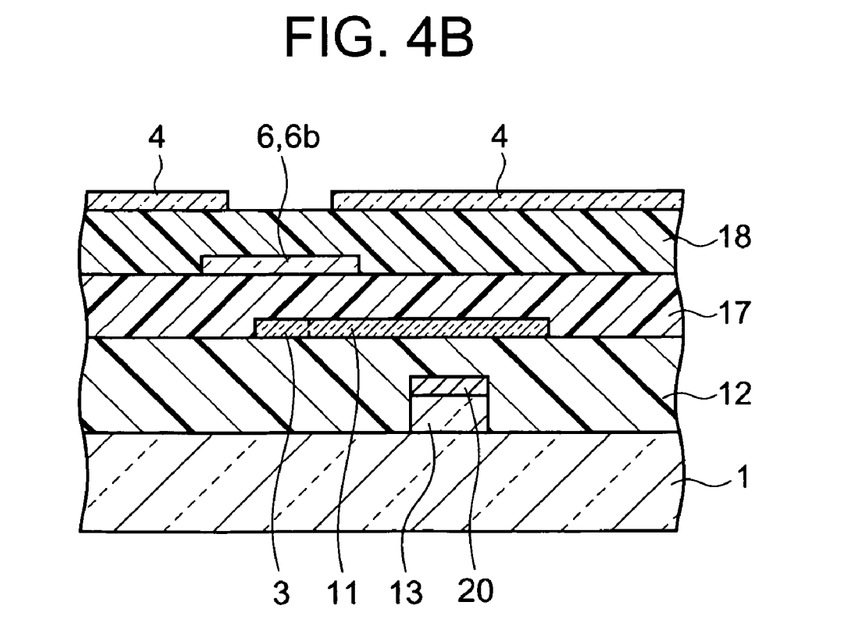
FIG. 4B is a sectional view taken along a line $IV_B$-$IV_B$ in FIG. 3.

FIG. 3 shows a plan view of the principal part of a thin film transistor panel in a liquid crystal display device as a second embodiment of the invention. FIG. 4A shows the sectional view taken along a line $IV_A$-$IV_A$ of FIG. 3, and FIG. 4B shows the sectional view taken along a line $IV_B$-$IV_B$ of FIG. 3. Also in this case, with an object for clarifying FIG. 3, the edge portions of the pixel electrodes 4 are hatched by oblique short solid lines.

In the thin film transistor panel, the respect that is greatly different from the thin film transistor panel shown in FIGS. 1, 2A and 2B is that each of the thin film transistors 5 is made to have a top gate structure. Accordingly, in the thin film transistor panel, the constituent elements having the same names as those of the constituent elements of the thin film transistor panel shown in FIGS. 1, 2A and 2B are denoted by the same reference marks as those of the constituent elements of FIGS. 1, 2A and 2B to be described.

In the thin film transistor panel, a source electrode 15, a drain electrode 16 and a data line 3 connected to the drain electrode 16, all made of a transparent electroconductive material such as ITO or the like, are formed on each of predetermined positions on the top face of a glass substrate 1. A semiconductor thin film 13 made of the transparent and intrinsic metal oxide described above is formed at a predetermined position on the top face of the source electrode 15, at a predetermined position on the top face of the drain electrode 16, and at a position between the electrodes 15 and 16 on the top face of the glass substrate 1. A protection film 20 made of silicon nitride is formed over the whole top face of the semiconductor thin film 13.

As the formation method of the semiconductor thin films 13 and the protection films 20, first, a semiconductor thin film forming film made of the intrinsic metal oxide and a protection film forming film made of the silicon nitride are continuously formed on the top face of the glass substrate 1 having the source electrodes 15, the drain electrodes 16 and the data lines 3 thereon by a plasma CVD method. Next, a resist pattern is formed on the top face of the protection film forming film, and etches the protection film forming film using the resist pattern as a mask to form the protection films 20.

Next, the resist pattern is exfoliated with a resist exfoliating liquid. In this case, although the surface of the semiconductor thin film forming film in the regions other than the portions under the protection films 20 is put to be exposed to the resist exfoliating liquid, no especial troubles are caused because the portions exposed to the resist exfoliating liquid are portions other than the device areas. That is, the semiconductor thin film forming films under the protection films 20 are protected by the protection films 20. Next, when the semiconductor thin film forming film is etched by using the protection films 20 as masks, the semiconductor thin films 13 are formed under the protection films 20.

A gate insulating film 12 made of silicon nitride is formed on the top face of the glass substrate 1 having the protection films 20, the data line 3 and the source electrodes 15 thereon. Gate electrodes 11 and scanning lines 2 connected to the gate electrodes 11, both made of a transparent p type or n type metal oxide, are formed at predetermined positions on the top face of the gate insulating film 12.

Here, the thin film transistors 5, each having the top gate structure, are composed of the gate electrodes 11, the gate insulating film 12, the semiconductor thin films 13, the protection films 20, the source electrodes 15 and the drain electrodes 16. In this case, because the gate electrodes 11 are formed of the transparent p type or n type metal oxide, and because the source electrodes 15 and the drain electrodes 16 are formed of the transparent electroconductive material such as the ITO or the like, the thin film transistors 5 have the structures which transmit light.

An interlayer insulation film 17 made of silicon nitride is formed on the top face of the gate insulating film 12 having the gate electrodes 11 and the scanning lines 2 thereon. An auxiliary capacity electrode 6 made of a light blocking metal such as aluminum, chromium or the like is formed at predetermined positions on the top face of the interlayer insulation film 17. An overcoat film 18 made of silicon nitride is formed on the top face of the interlayer insulation film 17 having the auxiliary capacity electrode 6 thereon.

Contact holes 19 are formed at the positions of the overcoat film 18, the interlayer insulation film 17 and the gate insulating film 12 which positions correspond to predetermined positions of the source electrodes 15. The pixel electrodes 4 made of a transparent electroconductive material such as ITO or the like are formed at predetermined positions on the top face of the overcoat film 18 in the state of being electrically connected to the source electrodes 15 through the contact holes 19. In this case, each of the pixel electrodes 4 is formed to cover almost all the part of each of the thin film transistors 5.

Then, because the thin film transistor panel is also configured so that the thin film transistors 5 may transmit light and each of the pixel electrodes 4 may cover almost all of each of the thin film transistors 5, the overlapping portions of the thin film transistors 5 and the pixel electrodes 4 contribute to the opening ratio of the thin film transistor panel, and consequently the opening ratio can be enlarged.

Third Embodiment

Figure 5A:
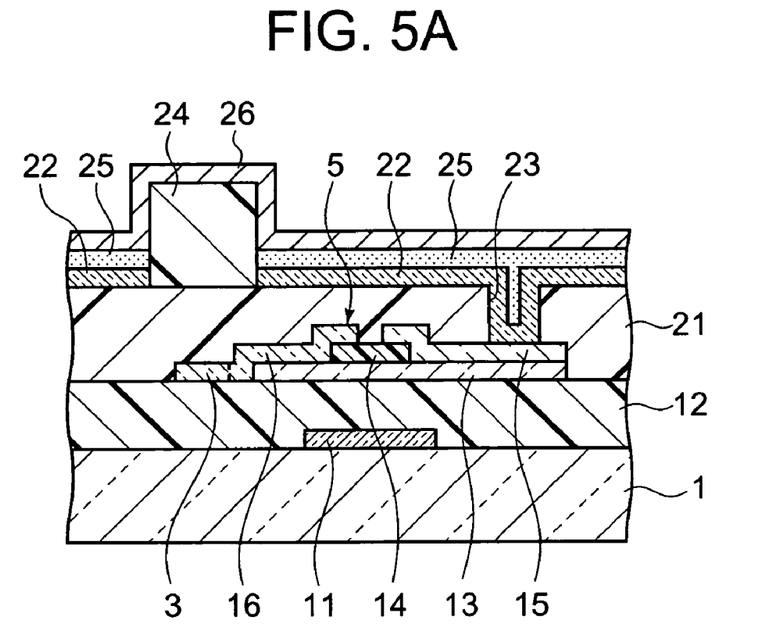
FIGS. 5A and 5B are sectional views of the principal part of an organic electroluminescence (EL) display device as a third embodiment of the invention.
Figure 5B:
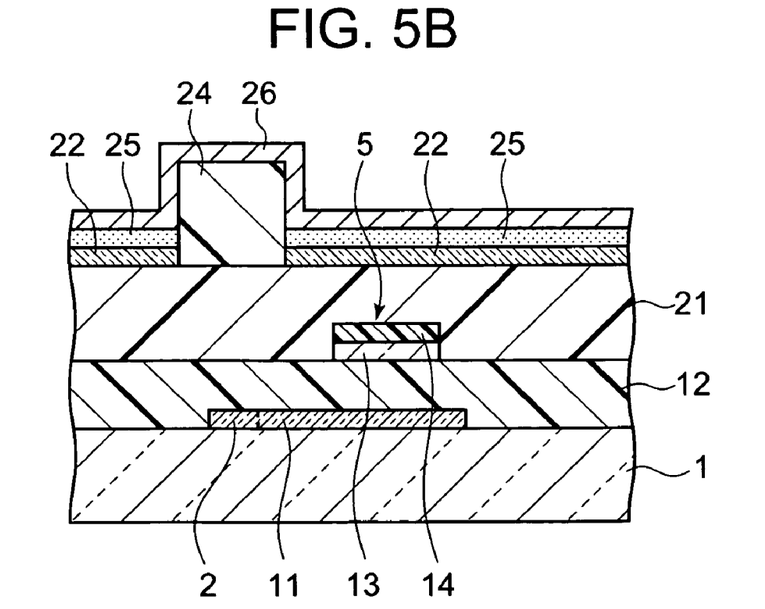

FIGS. 5A and 5B show the sectional views of the principal part of an organic electroluminescence (EL) display device as a third embodiment of the invention. In the organic EL display device, the same constituent elements as those of the thin film transistor panel shown in FIGS. 2A and 2B are denoted by the same reference marks as those in FIGS. 2A and 2B, and their descriptions are omitted. In the organic EL display device, light emitting portions made of the organic EL are formed on the thin film transistors 5. That is, the organic EL display device is configured as follows. A planarizing film 21 made of a transparent resin such as an acrylic resin or the like is formed on the top face of the gate insulating film 12 having the thin film transistors 5 thereon. Anode electrodes (electrodes for pixels) 22 are formed at predetermined positions on the tope face of the planarizing film 21 in the state of being electrically connected to the source electrodes 15 through contact holes 23 formed in the planarizing film 21. Partition walls 24 made of polyimide or the like are formed at predetermined positions on the top face of the planarizing film 21. Organic EL layers 25 are formed on the top faces of the anode electrodes 22 between the partition walls 24. A cathode electrode 26 is formed on the top faces of the organic EL layers 25 and the partition walls 24.

In this case, each of the anode electrodes 22 are formed so as to cover almost the whole portion of each of the thin film transistors 5. Moreover, the anode electrodes 22 are formed with a transparent electroconductive material such as ITO or the like, and the cathode electrode 26 is formed with high reflexibility metal such as aluminum. In the configuration, because the light emitted from one of the organic EL layers 25 is reflected by the cathode electrode 26, which is formed on the organic EL layer 25, to be launched to the side of the glass substrate 1, the configuration is called as a bottom emission type. In such a bottom emission type organic EL display device, the source electrodes 15 and the drain electrodes 16 are formed with the transparent ITO; the gate electrodes 11 and the semiconductor thin films 13 are formed with the transparent metal oxide; and the thin film transistors 5 transmit the light which has been emitted from the organic EL layers 25 and has been reflected by the cathode electrode 26. Consequently, the whole region of each of the thin film transistors 5 becomes the light emitting region, and the opening ratio thereof can be enlarged.

Modified Example of Third Embodiment

In the third embodiment described above, the source electrodes 15 of the thin film transistors 5 are formed with the n type metal oxides, and the anode electrodes 22 of the light emitting portions are formed with the transparent electroconductive material such as the ITO. However, it is also possible to make the source electrodes 15 of the thin film transistors 5 made of the n type metal oxide also have the functions of the anode electrodes 22 of the light emitting portions. As an example in such a case, the following configuration can be adopted. That is, in FIG. 5A, the contact holes 23 formed in the planarizing films 21 are made to have the same pattern as that of the source electrodes 15, and the n type metal oxides are formed on the whole top face of the semiconductor thin films 13 exposed through the contract holes 23, and are formed on the planarizing films 21 in the neighborhoods of the exposed semiconductor thin films 13. If the source electrodes 15 made of the n type metal oxides are used as the anode electrodes 22, and if the organic EL layers 25 and the cathode electrode 26 are formed to be laminated on the anode electrodes 22, then the configuration in which the source electrodes 15 are also used as the anode electrodes 22 can be obtained.

Other Embodiments

In the case of an organic EL display panel, two thin film transistors may be formed in an pixel, which is composed of a group of one of the anode electrodes 22, one of the organic EL layers 25 and the cathode electrode 26 (see, for example, JP 2004-171882A) Moreover, three thin film transistors may be formed in one pixel (see, for example, JP 2003-195810A).

According to the invention, the thin film transistors are formed to have the structures transmitting light, and each of the electrodes for pixels covers almost all of each of the thin film transistors. Consequently, the overlapping portion of each of the thin film transistors and each of the electrodes for pixels contributes to the opening ratio of the pixel, and the opening ratio can be enlarged.

The entire disclosure of Japanese Patent Application No. 2005-054402 which was filed on Feb. 28, 2005, including specification, claims, drawings and abstract, is incorporated into the invention in its entirety.

What is claimed is:

1. A thin film transistor panel, comprising:
   a transparent substrate;
   scanning lines made of a transparent electroconductive material, formed on the transparent substrate;
   data lines made of a transparent electroconductive material, formed on the transparent substrate to be perpendicular to the scanning lines;
   thin film transistors, each including a transparent gate electrode connected to one of the scanning lines, a transparent drain electrode connected to one of the data lines, a transparent source electrode, and a transparent semiconductor thin film made of a metal oxide and including a channel region at a middle portion thereof;
   transparent pixel electrodes connected to the thin film transistors; and
   a light blocking film formed between the transparent pixel electrodes and having a width wider than gaps between the transparent pixel electrodes so as to overlap with peripheral portions of the transparent pixel electrodes in a plan view, the light blocking film being formed continuously all the way along the scanning lines and the data lines without any break;

wherein the scanning lines and the data lines extend substantially all the way along the gaps between the transparent pixel electrodes; and wherein each of the transparent pixel electrodes is formed to cover a respective one of the thin film transistors, and the light blocking film is formed so as not to overlap with the channel regions of the transparent semiconductor thin films of the thin film transistors.

2. The thin film transistor panel according to claim 1, wherein in each of the thin film transistors, the drain electrode is made of a metal oxide including impurities.

3. The thin film transistor panel according to claim 2, wherein in each of the thin film transistors, the drain electrode and the source electrode are formed on the semiconductor thin film.

4. The thin film transistor panel according to claim 1, wherein in each of the thin film transistors, the gate electrode is made of a metal oxide including impurities, and the drain electrode is made of a transparent electroconductive material.

5. The thin film transistor panel according to claim 4, wherein in each of the thin film transistors, the drain electrode and the source electrode are formed below the semiconductor thin film.

6. The thin film transistor panel according to claim 4, wherein in each of the thin film transistors, the metal oxide of the gate electrode includes p type impurities.

7. The thin film transistor panel according to claim 4, wherein the scanning lines are formed with a same material as the gate electrodes, and the data lines are formed with a same material as the drain electrodes.

8. The thin film transistor panel according to claim 1, wherein each of the transparent pixel electrodes is formed with a transparent electroconductive material, and is connected to a corresponding one of the source electrodes of the thin film transistors.

9. The thin film transistor panel according to claim 1, wherein the light blocking film comprises an auxiliary capacity electrode which is provided between the transparent pixel electrodes and the data lines through an insulation film.

10. The thin film transistor panel according to claim 9, wherein the auxiliary capacity electrode is formed with a grid-like light blocking metal to cover the scanning lines and the data lines, and the auxiliary capacity electrode has a width wider than widths of each of the scanning lines and the data lines.

11. The thin film transistor panel according to claim 1, further comprising light emitting portions, each provided with an anode electrode, an organic EL layer and a cathode electrode, wherein in each of the thin film transistors, the drain electrode is made of a metal oxide including impurities.

12. The thin film transistor panel according to claim 11, wherein an extended portion of the source electrode of each of the thin film transistors is formed as the anode electrode of each of the light emitting portions.

13. The thin film transistor panel according to claim 1, further comprising light emitting portions, each provided with an anode electrode, an organic EL layer and a cathode electrode, which is provided on each of the thin film transistors through an insulating layer.

14. The thin film transistor panel according to claim 13, wherein the insulating layer is a planarizing film.

15. The thin film transistor panel according to claim 13, wherein the anode electrode, the organic EL layer and the cathode electrode are laminated in order from a side of the insulating layer.

16. The thin film transistor panel according to claim 15, wherein the cathode electrode is a reflecting electrode.

* * * * *